United States Patent
Connelly et al.

(10) Patent No.: US 7,972,916 B1
(45) Date of Patent: Jul. 5, 2011

(54) METHOD OF FORMING A FIELD EFFECT TRANSISTORS WITH A SACRIFICIAL STRESSOR LAYER AND STRAINED SOURCE AND DRAIN REGIONS FORMED IN RECESSES

(75) Inventors: Daniel J. Connelly, San Francisco, CA (US); Paul A. Clifton, Mountain View, CA (US); R. Stockton Gaines, Pacific Palisades, CA (US)

(73) Assignee: Acorn Technologies, Inc., Santa Clara, CA (US)

( * ) Notice: Subject to any disclaimer, the term of this patent is extended or adjusted under 35 U.S.C. 154(b) by 465 days.

(21) Appl. No.: 12/256,357

(22) Filed: Oct. 22, 2008

(51) Int. Cl.
*H01L 21/336* (2006.01)
(52) U.S. Cl. .. 438/197; 438/300; 438/585; 257/E21.542
(58) Field of Classification Search .................. 438/197, 438/300, 585; 257/E21.542
See application file for complete search history.

(56) References Cited

U.S. PATENT DOCUMENTS
7,338,834 B2 *   3/2008   Clifton .......................... 438/95

OTHER PUBLICATIONS

Shyam Gannavaram, "Low Temperature (≦800 ° C.) Recessed Junction Selective Silicon-Germanium Source/Drain Technology for Sub-70 nm CMOS," 2000 IEEE Xplore, IEDM 00-437-440.
Scott E. Thompson, et al. "A 90-nm Logic Technology Featuring Strained-Silicon," IEEE Transactions of Electron Devices, vol. 51, No. 11, Nov. 2004.

* cited by examiner

*Primary Examiner* — Jack Chen
(74) *Attorney, Agent, or Firm* — Orrick Herrington & Sutcliffe, LLP

(57) ABSTRACT

The process forms a FET with a channel region that has in plane compressive stress in one direction and in plane tensile stress in a perpendicular direction. The process deposits a germanium silicon sacrificial stressor layer on a silicon substrate so that the germanium silicon is in a state of compressive stress. Etching trenches forms silicon pillars covered by the stressor layer and transfers tensile strain to the upper portion of the pillar. The process fills the trenches with stiff insulating material to maintain the strain in the pillar and etching removes the stressor layer. More etching creates recesses on either side of a channel region in the upper portion of the pillar. Doped germanium silicon layers fill the recesses, apply lateral compressive stress to the pillar's channel region and act as source and drain electrodes. A gate is formed above the strained channel region.

26 Claims, 4 Drawing Sheets

METHOD OF FORMING A FIELD EFFECT TRANSISTORS WITH A SACRIFICIAL STRESSOR LAYER AND STRAINED SOURCE AND DRAIN REGIONS FORMED IN RECESSES

FIELD OF THE INVENTION

The present invention relates to strained semiconductor devices that incorporate strained active layers. The invention also relates to methods of making strained semiconductor devices using a sacrificial stressor layer and further processing to achieve desired strain engineering.

DESCRIPTION OF THE RELATED ART

Strained silicon is widely viewed as an important technology for obtaining desired advancements in integrated circuit performance. Mobility enhancement results from a combination of reduced effective carrier mass and reduced intervalley (phonon) scattering. For MOS field effect transistors (MOSFETs) fabricated on conventional {100} oriented silicon substrates with conduction primarily along orthogonal <110> crystal axes, n-channel MOSFETs achieve improved performance with induced biaxial tensile stress in the top silicon layer along both the width and length axes of the active area. p-channel MOSFETs exhibit improved performance with induced uniaxial tensile stress in the top silicon layer along the width axis only (transverse tensile stress). p-channel MOSFETs also exhibit improved performance with induced uniaxial compressive stress in the top silicon layer along the length axis only (longitudinal compressive stress).

Compressive or tensile strain can be provided selectively in a silicon surface layer, for example, by using germanium silicon or silicon carbon stressors in the source and drain regions of a MOSFET to induce a desired compressive or tensile strain along the length (longitudinal) axis of the MOS FET channel. Providing stressors in this way begins by etching trenches or recesses in the source and drain region and then filling these trenches or recesses with a strained conductor, in particular an epitaxial (pseudomorphic) semiconductor with an equilibrium lattice constant different from that of the semiconductor substrate. For a channel region formed in silicon with a (001) oriented channel and transport in the [100] direction, a source and drain can be filled with an alloy of germanium and silicon yielding longitudinal compressive strain in the channel. Or, for a channel region formed of silicon, a source and drain can be filled with an alloy of silicon and carbon, yielding longitudinal tensile strain in the channel. The strain in the conductor filling these source and drain recesses then partially relaxes, transferring strain to the semiconductor region in which the channel is to be formed. This can result in more favorable carrier transport, allowing for increased drive current or faster switching.

Strained silicon is conventionally obtained by first growing a thick layer of germanium silicon alloy on a silicon substrate. The germanium silicon layer is grown to a sufficient thickness that the germanium silicon layer is relaxed to an unstrained condition at its surface. The in-plane lattice parameter of the germanium silicon surface is similar to that of a bulk crystal of germanium silicon of the same composition. germanium silicon alloys have larger lattice parameters than silicon. Hence the relaxed surface of the germanium silicon layer provides an in-plane lattice parameter larger than that of silicon. A subsequent thin layer of silicon is grown epitaxially on the relaxed surface of the germanium silicon layer. The thin epitaxial layer of silicon assumes the larger in-plane lattice parameter of the germanium silicon and grows in a strained state with bonds in the crystal lattice elongated in the growth plane. This approach, sometimes known as substrate-strained silicon or "virtual substrate" technology, grows a thin pseudomorphic layer of silicon on the relaxed surface of a germanium silicon layer.

So long as the strained silicon layer does not exceed a "critical thickness" for strain relaxation and some care is taken, the tensile strain is maintained in the strained silicon layer throughout the various implantation and thermal processing steps typical of CMOS manufacturing.

The use of a relaxed SiGe layer as a "virtual substrate" to strain a subsequently deposited epitaxial silicon layer inevitably requires acceptance of a very high dislocation density in the SiGe layer because the SiGe relaxation mechanism is plastic in nature. In other words, relaxation in the SiGe layer occurs through the generation of strain-relieving misfit dislocations. A SiGe layer thinner than the critical thickness on a silicon substrate is not relaxed and exhibits few misfit dislocations. If the SiGe layer is thicker than the critical thickness, the strained lattice undergoes plastic deformation and the strain is relieved by the nucleation and propagation of misfit dislocations. Some fraction of misfit dislocations give rise to threading dislocations (at least $10^4$-$10^5$ cm$^{-2}$) which propagate through the overlying strained silicon layer. Threading dislocations represent extended defects and give rise to multiple undesirable consequences in MOSFETs including source/drain junction leakage, reduction of channel mobility, variability of threshold voltage and enhanced diffusion paths leading to potential drain-to-source shorting in short-channel MOSFETs.

SUMMARY OF THE PREFERRED EMBODIMENTS

An aspect of the present invention provides a method of manufacturing a semiconductor device, comprising forming a sacrificial stressor layer over a semiconductor region having a semiconductor surface. The sacrificial stressor layer is formed in a stressed state in comparison to its equilibrium state. Stress is transferred from the sacrificial stressor layer to the semiconductor region to strain the semiconductor region. The strain is stabilized in the semiconductor region and removing at least portions of the sacrificial stressor layer so that strain is present in the semiconductor region extending along at least a first in plane direction and a second in plane direction. First and second recesses are etched through the semiconductor surface and into the semiconductor region to form a defined semiconductor region. The etching at least partially relaxes strain along the first direction within the defined region. A transistor is formed so that at least a portion of a channel region of the transistor is within the defined semiconductor region.

Another aspect of the present invention provides a method of manufacturing a semiconductor device, comprising depositing a sacrificial stressor layer on a semiconductor region having a semiconductor surface. The sacrificial stressor layer is deposited to have compressive stress in comparison to its equilibrium state. Trenches are etched through the sacrificial stressor layer and through the semiconductor region to provide a strained region defined laterally on sides by trench walls. The trenches at least partially relax the sacrificial stressor layer. The trenches are filled to form trench isolation structures and at least portions of the sacrificial stressor layer are subsequently removed so that tensile strain is present in the semiconductor region extending along at least a first in plane direction and a second in plane direction. First and second recesses are etched through the semiconductor surface and into the semiconductor region to form a defined semiconductor region. The etching at least partially relaxes tensile strain along the first direction within the defined semiconductor region. Source and drain stressor regions are formed in the first and second recesses to induce compressive strain along the defined semiconductor region. A transistor is formed so that at least a portion of a channel region of the transistor is within the defined semiconductor region.

DETAILED DESCRIPTION OF THE PREFERRED EMBODIMENTS

Figure 1:
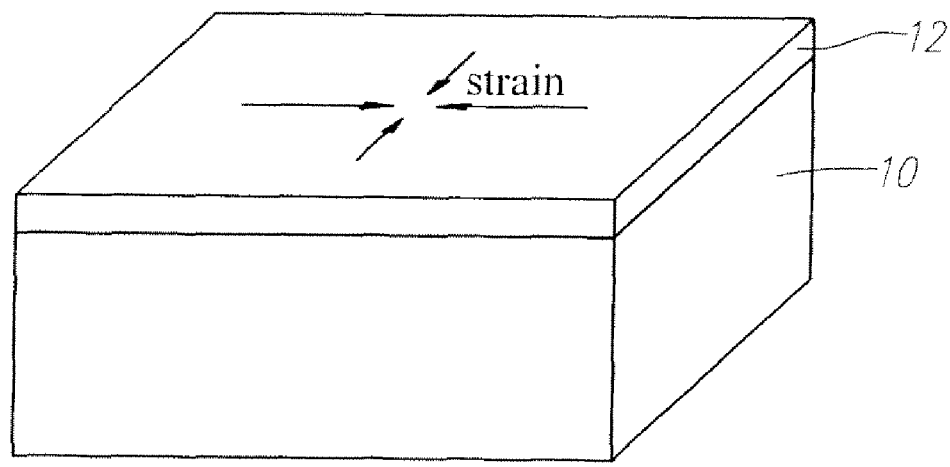
FIGS. 1-7 illustrate process steps according to aspects of the present invention for forming a strained semiconductor active region.

Aspects of preferred embodiments of the present invention create a strained semiconductor active region using, for example, strained semiconductor source and drain conductors in combination with a sacrificial stressor layer. That is, a process according to certain aspects of the present invention can strain an active semiconductor region by transferring strain from a sacrificial stressor layer formed above the active semiconductor region and from strained source and drain regions formed in recesses laterally adjacent the active semiconductor region. Most preferably, the sacrificial stressor layer is used to create biaxial or multidimensional in-plane strain and the process of forming recesses relaxes strain along one direction. Further processing may apply compressive stress to an active region along that one direction. Preferably, a field effect transistor incorporates a channel region that corresponds to and is at least partially coextensive with a defined region that is tensile strained in one direction and compressive strained in a second direction. Alternately, a preferred process may form a field effect transistor with a channel region that has tensile strain along the one direction and is at least partially along a second direction.

As a specific example, a process according to preferred aspects of the present invention may form a field effect transistor with a channel region that has in plane compressive strain in one direction and in plane tensile strain in a perpendicular direction. The process deposits a germanium silicon sacrificial stressor layer on a silicon substrate so that the germanium silicon is deposited in a state of compressive stress. Etching trenches forms silicon pillars covered by the stressor layer and induces tensile strain in the upper portion of the pillar. The process fills the trenches with stiff insulating material to maintain the strain in the pillar and etching preferably removes the stressor layer. More etching creates recesses on either side of a channel region in the upper portion of the pillar. Etching recesses into the upper portion of the pillar relaxes tensile strain near the top of the silicon pillar in one in-plane direction, which helps achieve a desired level of strain engineering. Doped germanium con layers may be epitaxially grown to fill the recesses and, in that case, are deposited in a state of compressive stress that applies lateral compressive stress to the pillar's channel region. Preferably the doped germanium silicon layer act as source and drain electrodes. Doping the source and drain strained germanium silicon layers preferably is accomplished in situ. Other processing, which may be performed before etching the recesses, forms a gate dielectric and a gate above the strained channel region.

Preferred aspects of the present invention may provide a method of manufacturing semiconductor devices that selectively creates tensile strain along a first direction and compressive strain along a second direction, both in a defined semiconductor region. The first and second directions are at angles and, in a particularly preferred embodiment, the first and second directions are perpendicular and both the first and second directions extend in-plane, parallel to an interface or surface of the defined semiconductor region. Preferred implementations of the present invention utilize a sacrificial stressor layer, both created and removed during processing, to achieve at least in part the first direction of strain in the defined semiconductor region. Preferably the second direction of strain is achieved at least in part by removing semiconductor regions adjacent the defined semiconductor region and replacing the removed semiconductor regions with second stressors, preferably selected to create strain in the defined semiconductor region. The process of removing relaxes tensile strain along one in-plane direction in the upper portion of the pillar in a manner that facilitates the second stressors creating compressive strain.

Device manufacturing methods accord to preferred embodiments of the invention can have an advantage of providing desired, sometimes complex, strain environments in a defined semiconductor region using processing strategies that are in many cases less expensive or more reliably implemented than other strategies for creating strained semiconductor regions. In other implementations, the strategies described here can be combined with other techniques to provide more precisely engineered or, in some cases, greater levels of strain.

One particularly useful product of processing a semiconductor wafer (or other workpiece) according to the methods described here is that the finished wafer could have p-channel field effect transistors (FETs) that incorporate channels that are tensile strained along a direction transverse to the direction between the source and drain and that are compressively strained along the longitudinal direction between the source and the drain. This configuration of strain in the channel of a p-channel FET is understood to be advantageous for the performance of p-channel FETs.

For transistors, it may be advantageous that the stress along one direction be of a different character than the stress along the orthogonal direction. For example, for a p-channel FET formed in silicon with a (001) surface and with current flowing in the [110] direction between the source and the drain, transistor performance improves when the transistor has compressive strain between the source and drain and tensile strain along the surface perpendicular to the transverse direction between the source and the drain. An epitaxial source and drain formed from, for example, germanium silicon can be used to induce longitudinal (i.e., between the source and drain, for example, a [110] direction with a (001) channel) compression. Using epitaxial germanium silicon source and drain regions can induce longitudinal compression without inducing transverse (i.e., perpendicular to the direction between the source and drain, yet still parallel to the channel, for example, [1 $\bar{1}$ 0] with a (001) channel) strain. In another useful configuration, an n-channel FET with a (001) channel and conduction in the [100] direction benefits from longitudinal (for example, [100]) tension, but transverse (for example, [010]) compression. Both the p-channel FET and the n-channel FET configurations described here can be accomplished using aspects of the present invention.

An alternate, and in some instances preferred, strategy for forming source and drain stressor regions is to form metal silicide source and drain regions. This alternate process forms recesses on either side of a channel region and then deposits a metal that can be reacted to form a metal silicide with the recesses. For example, an appropriate metal might be tungsten, cobalt or nickel. Alternately, for an n-channel FET, a low work function silicide may be formed using a low work function metal such as erbium, ytterbium, dysprosium, or another rare earth metal. For a p-channel FET, a high work function silicide may be preferred, for example formed with platinum or iridium. Well known processing is then used to react the metal with the silicon around the recess to form a metal silicide. As is known, it is possible to form metal silicides so that the material expands, applying compressive force lateral including on the channel region. In this manner, the metal silicide can create compressive stress along the in plane direction between the source and drain. Metal source and drain regions, for example formed in this manner, provide higher conductivity and so are in some implementations are presently preferred.

The following description is provided primarily in terms of a strained silicon active region or layer, but the solutions and strategies described here have application to other semiconductors and semiconductor systems. In addition, the following description is made in terms of applying strain to an active semiconductor region, but this nomenclature is used for clarity and is not intended to limit application of the described strategies to specific regions or layers. In presently contemplated implementations, the semiconductor region to which strain is transferred is used as at least a portion of an active layer for at least some of the devices formed by the processes described here but strain can be applied to layers other than active layers.

Processing according to a preferred embodiment begins as shown in FIG. 1 with a silicon substrate 10 having characteristics such as conductivity and orientation that are desirable for a p-channel FET. In practical implementations a substrate might be a 300 millimeter or 450 millimeter wafer, but any size substrate could be used. The process deposits a blanket stressor layer 12 over the surface of the substrate 10. In this example, the stressor layer 12 might be a material such as germanium silicon that is under compressive stress when it is deposited on the surface of the silicon substrate 10. Most preferably the blanket stressor layer is deposited to a thickness of less than or equal to the critical thickness for germanium silicon of the composition selected for the stressor layer 12. U.S. Pat. No. 7,338,834 discusses critical thickness and that discussion is incorporated by reference here. Because this germanium silicon layer 12 extends over the entire relaxed surface of the silicon substrate 10, at least a portion of the strain energy remains in the germanium silicon layer 12 following deposition.

Figure 2:
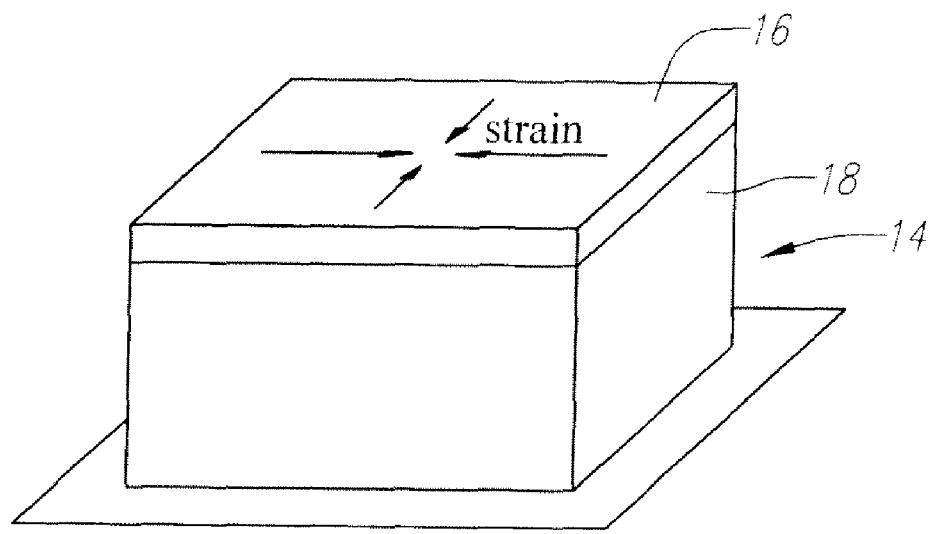

The process continues as shown in FIG. 2 to etch a continuous trench 14 through the germanium silicon layer 12 and into the silicon substrate 10 so that the illustrated process forms, for example, a rectangular or square germanium silicon layer 16 on a rectangular or square silicon pillar 18 that has a rectangular or square cross section at the interface with the germanium silicon layer 16. The trench 14 extends around the pillar 18 on its four sides and the base of the pillar 18 is attached to the substrate. In particularly preferred embodiments, the illustrated continuous trenches can be formed using etching and other processing conventionally used for forming trench isolation structures. Advantageously, the illustrated continuous trenches can be positioned as would be appropriate for trench isolation and eventually incorporated into trench isolation structures. Forming continuous trenches and distinct pillars is particularly preferred at the present time, but other configurations of active regions and trenches can be used.

The process of etching the trench causes the germanium silicon layer 16 to relax to a greater extent and to transfer strain more completely to the silicon pillar 18, preferably creating a desired level of tensile strain along all in-plane directions of an upper portion of the pillar 18 near the germanium silicon layer 16. For a sufficiently small pillar 18 (in lateral cross section) and a sufficiently deep trench 14, an upper portion of the pillar will have tensile strain extending across it. This process of relaxation and strain transfer is referenced as edge relaxation. Edge relaxation strategies are described in U.S. Pat. No. 7,338,834, which patent is incorporated by reference in its entirety for its teachings regarding edge relaxation and creating strained semiconductor layers. Edge relaxation patterns a multilayer structure so that a compressively or tensile strained stressor layer can relax and expand laterally to in turn induce strain in another layer. By selecting appropriate combinations of materials, edge relaxation can create tensile or compressive strain in another layer. Following the teachings of U.S. Pat. No. 7,338,834, it is preferable in implementing this discussion's examples that at least one lateral dimension of the pillar such as a width is sufficiently small so that the upper portion of the pillar is tensile strained across that dimension. An appropriate lateral dimension of the pillar may be two hundred nanometers or less.

After the trench is etched as shown in FIG. 2, the trench 14 is filled with a stiff material 20 such as silicon oxide ($SiO_2$) or a combination of silicon nitride and silicon oxide. Conventional trench fill growth and deposition processes are preferably used in these implementations. Most preferably, the trench fill material 20 and fill strategy create a structure that maintains strain transferred to the upper portion of the pillar 18 by the sacrificial stressor layer 16. Preferably the trench fill material 20 is insulating so that the trench and the fill material 20 can form a trench isolation structure. It should of course be appreciated that the trench fill material 20 and the pillar 18 are not isolated but are instead part of a repeated pattern or repeated instances across the surface of the substrate. Inner (interface) portions of the trench fill material 20 are in contact with the side walls of the pillar 18 and outer (interface) portions of the trench fill material 20 are in contact with the substrate. This configuration allows the trench fill material 20 to press against the pillar 18, maintaining the tensile strain within an upper portion of the pillar 18. Trench etching, trench dimensions, fill material growth or deposition, and planarizing techniques typically used in forming trench isolation structures can be used in forming the FIG. 3 trench isolation structure.

Figure 4:
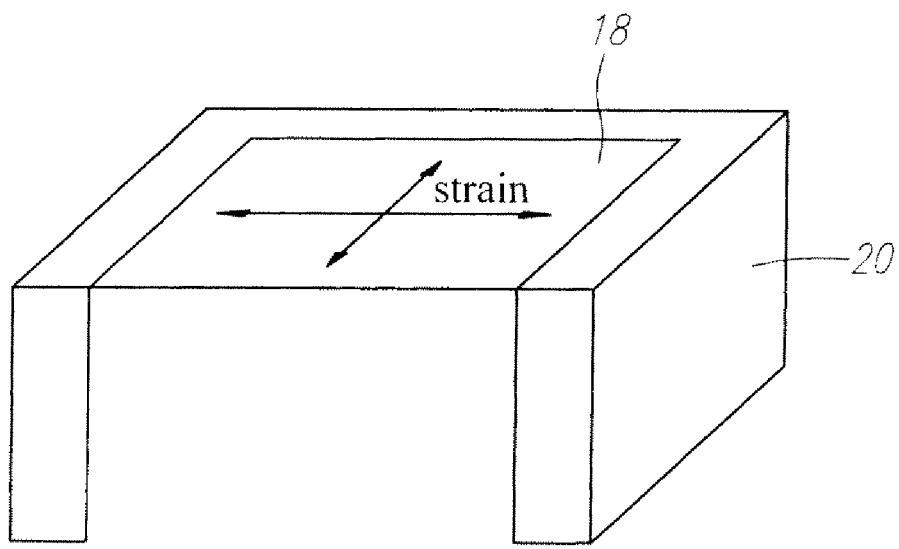

After the trench is filled in a manner that can stabilize and maintain the tensile strain in the pillar 18, the germanium silicon layer 16 preferably is removed, for example, using a selective etch to form the structure shown in FIG. 4. Selective wet and dry etches are known for the preferential removal of the germanium silicon stressor layer 16, leaving the silicon surface of the pillar 18 underneath unetched and undamaged. As an example, a mixture of hydrofluoric acid (HF), hydrogen peroxide ($H_2O_2$), and acetic acid ($CH_3COOH$) can selectively etch silicon germanium layers from a silicon surface of a substrate at selectivities of 300:1 or more.

This discussion uses the term sacrificial stressor layer to identify a layer of material provided over an active semiconductor layer so that the stressor layer can be used to stress regions of the active semiconductor layer. Preferably the stressor layer is removed following transfer of at least a portion of the stress from the stressor layer to the underlying active semiconductor layer, so that the stressor layer is appropriately considered a sacrificial layer. The sacrificial stressor layer may have compressive or tensile stress as deposited, depending on the type of strain to be provided to the active semiconductor layer. Preferred implementations of the present invention use a sacrificial stressor layer in combination with compressive strain applied laterally through stressed source and drain regions to create a desired strain environment in a defined semiconductor region. Aspects of the present invention can be used in combination with a buried stressor layer. Often, however, methods according to the present invention provide an advantage from not incorporating a buried stressor structure.

Removing the stressor layer allows more conventional processing to be used in the rest of the manufacturing process. Because the stressor layer preferably has the dedicated function of creating strain in an underlying layer and then is removed, this layer is a sacrificial stressor layer as that term is used here. FIG. 4 shows that, after the sacrificial stressor layer 16 is removed, the surface of the pillar 18 is under tensile strain, which extends in all in-plane directions.

Figure 5:
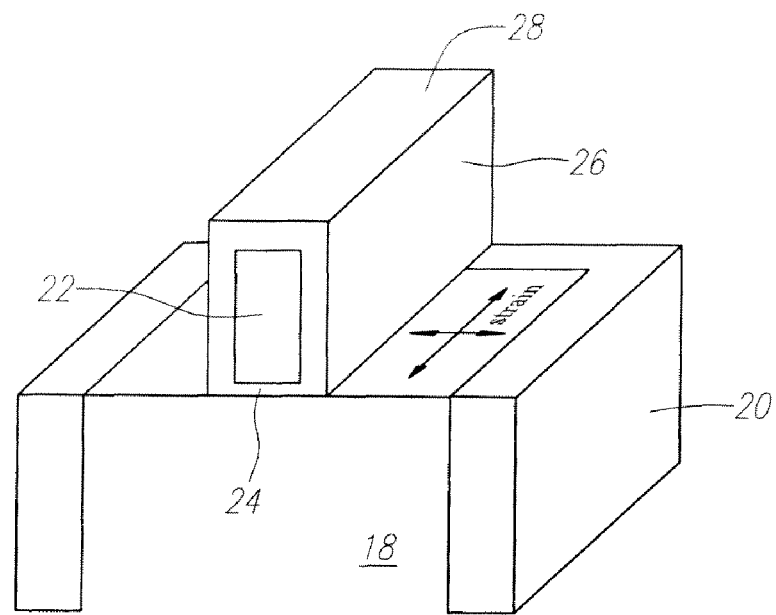

Typical processing techniques are then used to form a gate stack, preferably including a gate electrode 22, a gate insulator 24, insulating spacers 26 on either side of the gate electrode 22 and an insulating cap 28 over the gate electrode as shown in FIG. 5. Conventional processing would form source and drain regions on either side of the gate electrode 22. Instead of proceeding conventionally, preferred embodiments of the present invention include a process for introducing a second component of strain extending in a second dimension within the defined semiconductor region. Most preferably, such a defined semiconductor region forms at least a portion of a region ("the channel region") in which a channel is formed during operation of, for example, a p-channel field effect transistor.

Figure 6:
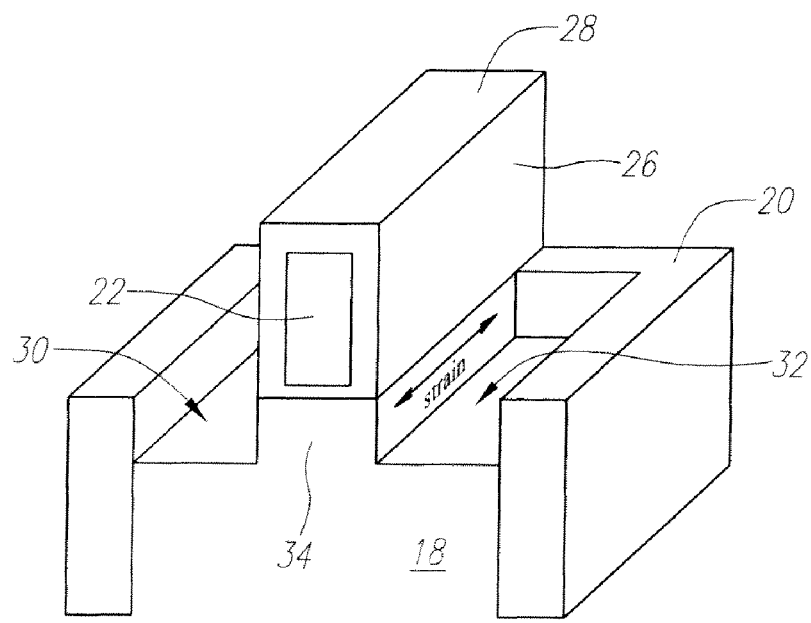

Consequently, preferred processes according to aspects of the present invention continue by forming additional stressor regions on either side of the gate stack. Using the insulating spacers 26, insulating cap 28 and insulating trench fill material 20 as an etch mask, anisotropic etching removes regions 30 and 32 and preferably also defines a semiconductor region 34 below the gate stack as shown in FIG. 6. Preferably regions 30 and 32 are etched to a depth sufficient to allow the semiconductor 34 below the gate stack to relax along the direction extending between the etched regions 30 and 32 and to allow stressors formed in the etched regions 30 and 32 to create a desired level of strain in the region 34. Forming the illustrated recesses is a particularly useful process in that it relaxes the tensile strain created along the longitudinal direction extending in the channel between the recesses 30 and 32. As illustrated, tensile strain remains in region 34 along the direction of the longer (width) dimension of the illustrated gate electrode 22. Appropriate etching techniques are known for the preferred silicon pillar 18 and preferred insulators silicon oxide and silicon nitride that might be used in, along or on the gate stack.

Figure 7:
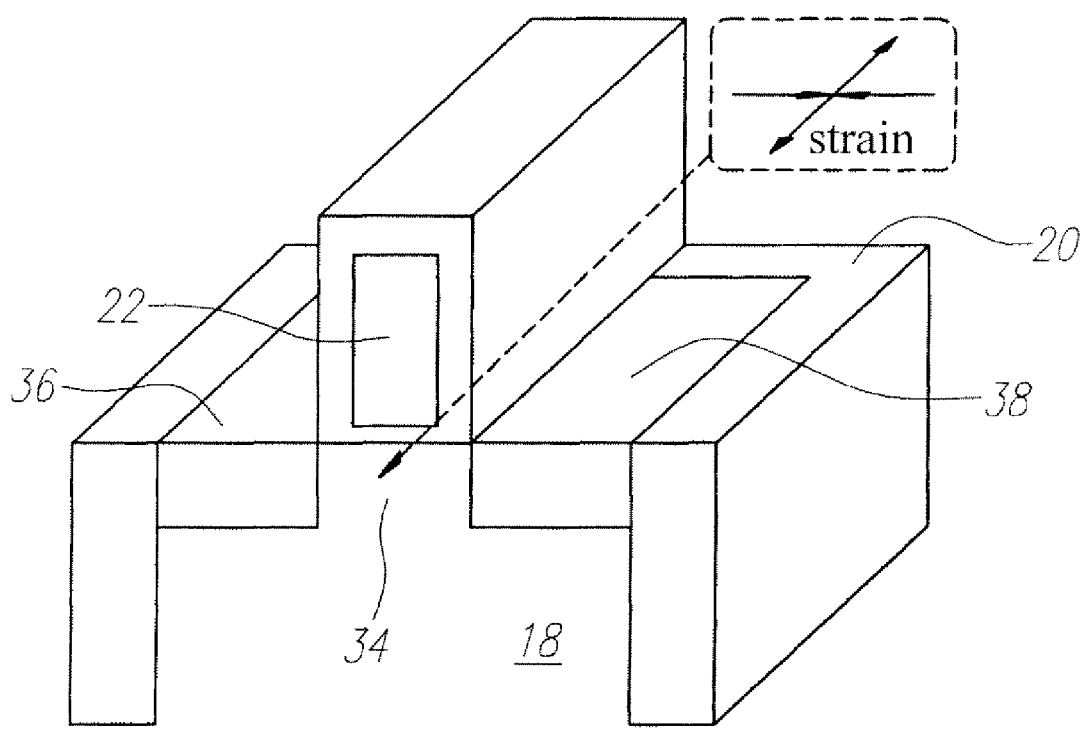

Next, stressor regions 36 and 38 are formed in the openings 30 and 32 so as to apply compressive stress to the region 34 as shown in FIG. 7. Preferred stressor regions 36 and 38 may, for example, be formed from pseudomorphic germanium silicon deposited epitaxially on the preferred silicon surfaces within etched or recessed regions 30 and 32. Most preferably, the germanium-silicon stressor regions 36 and 38 are doped during deposition so that the regions 36 and 38 form source and drain regions for the illustrated field effect transistor. For the preferred p-channel FET implementations, the germanium silicon regions 36 and 38 may be doped p-type in situ during deposition. To allow for the regions 36 and 38 to function as stressors with respect to the defined semiconductor region 34, regions 36 and 38 preferably are germanium silicon having a germanium concentration of 20-30% or more greater than the germanium concentration in the underlying interface with the recesses 30, 32 within the pillar 18. Because increasing amounts of germanium within the germanium silicon increases the equilibrium lattice constant of the germanium silicon, growing pseudomorphic germanium silicon regions 36, 38 with the recesses 30, 32 in the pillar 18 creates compressive strain within the defined semiconductor region 34.

An alternate, and in some instances preferred, strategy for forming source and drain stressor regions 36, 38 is to form metal silicide source and drain regions. This alternate process deposits a metal that can be reacted to form a metal silicide with the recesses 30, 32. For example, an appropriate metal might be tungsten, cobalt, nickel, erbium, ytterbium, dysprosium, platinum or iridium. Well known processing is then used to react the metal with the silicon around the recess to form a metal silicide. As is known, it is possible to form metal silicides so that the material expands, applying compressive force lateral including on the channel region. In this manner, the metal silicide can create compressive stress along the in plane direction between the source and drain regions 36, 38. As discussed above, the higher conductivity of metallic source or drain regions, as compared to a doped semiconductor, can be advantageous for certain configurations and transistor implementations.

It should be noted that etching the recesses into the pillar allows the upper region of the pillar to relax in a direction extending between the inner side walls of each of the etched regions. The tensile strain extending in at least a direction extending parallel to the inner side walls of the recesses continues to be maintained by the trench fill material and preferably does not relax in the process of forming the recesses. In a particularly preferred aspect of this process, the recesses are created through self aligned etching using the gate stack, especially the cap, as an etching mask. It would of course be possible to etch the recesses prior to forming the gate stack. The process in which the gate stack is formed prior to forming the recesses is currently preferred due to its simplicity and greater manufacturability. The result of these preferred processes is to form a p-channel MOSFET in which the channel has longitudinal compressive strain and transverse tensile strain, which provides marked improvements in drive current or faster switching or both. An alternate implementation might form a p-channel transistor with transverse tensile strain and with relaxed (low) longitudinal strain, depending on whether source and drain stressors are formed in the process.

In an alternate implementation that may have advantages in manufacturing, the sacrificial stressor layer (16 in FIG. 2) may be formed of stressed silicon nitride. A thin film of silicon nitride may be deposited, for example by plasma enhanced chemical vapor deposition (PECVD), in a condition of either tensile or compressive stress as deposited. For example, Applied Materials reports that its Producer Celera system for plasma-enhanced CVD (PECVD) offers an integrated stress silicon nitride deposition and UV cure solution which delivers tensile stress of up to 1.7 GPa, with extendibility to 2.0 GPa, while meeting low thermal budget requirements. The same deposition chamber can deposit silicon nitride films with compressive stresses up to 3.5 GPa. By varying input factors in the PECVD process, predictable amounts of either tensile or compressive built-in stress in the range 1.7 GPa tensile to 3.0 GPa compressive can be selectively incorporated in a deposited silicon nitride thin film Silicon nitride may be preferred over epitaxial silicon germanium as a sacrificial stressor material for several reasons. Deposition of silicon nitride by PECVD is in general a lower cost process than growth of epitaxial silicon germanium on silicon. Stressed silicon nitride may be applied conveniently as a sacrificial stressor on a wide range of semiconductor substrates other than silicon including germanium, group III-V and group II-VI compound semiconductors. Silicon nitride can be deposited in a state of either tensile or compressive stress which allows a process to induce either compressive or tensile strain in the underlying semiconductor, respectively. In addition to serving the role of sacrificial stressor, the silicon nitride can be used as a hard mask for patterning trenches by plasma etch processes. The silicon nitride may also be used conveniently as the polish stop layer when planarizing the trench fill material by chemical mechanical polishing.

Many of the different stressors described here, whether as a recessed germanium silicon source or drain region or a sacrificial stressor layer, can be multilayer structures with stresses distributed uniformly or non-uniformly among the different layers of the structures.

Whatever material or materials is selected for the sacrificial stressor layer and source or drain stressors, preferred processes can select and independently control the relative amounts of stress directed along each of the primary axes of a semiconductor device, for example, corresponding to the width axis and length axis of a p-channel MOSFET. The amount of stress directed along different axes may be controlled in part through the spacing of the isolation trenches determined by the layout of the mask used to define the active area of the devices. Where in-plane stress is not desired in the semiconductor along a particular axis in a semiconductor device, the trenches preferably are spaced sufficiently far apart along that axis such that the effect of the edge relaxation mechanism is suitably minimized. Conversely, where in-plane stress is desired in the semiconductor along a particular axis in a semiconductor surface portion, the trenches preferably are spaced sufficiently close together along that axis so the effect of the edge relaxation mechanism is suitably maximized. The isolation trenches subsequently are filled with a suitable insulator using any of the shallow trench isolation (STI) fill processes already well established in the CMOS IC industry or that may be introduced in the future. Preferably the trench fill is performed to maintain the desired stress properties of adjacent active regions.

As another specific example, a process according to preferred aspects of the present invention may form a p-channel field effect transistor with a channel region that has compressive stress in one longitudinal direction and tensile stress in a perpendicular transverse direction. Trenches are etched into a silicon substrate to form a silicon pillar. The trenches are filled with a compliant material such as, for example, borophosphilicate glass, which is a doped silicon oxide glass that can be made compliant and to flow by heating. Following the deposition of the compliant material, the process then selectively deposits a germanium silicon sacrificial stressor layer on the surface of the silicon pillar so that the germanium silicon is deposited in a state of compressive stress. The trench fill material is processed to solidify and stiffen the trench fill material, preferably to maintain the stress applied to the pillar after the removal of the sacrificial stressor layer. Etching removes the germanium silicon layer. Additional, particularly preferred etching of the silicon upper portion of the pillar forms recesses in the upper portion of the pillar and relieves strain along a longitudinal axis of a channel for a p-channel MOSFET. Germanium silicon layers are formed on either side of the channel region to apply compressive stress laterally to the pillar's silicon channel region along the longitudinal axis. The germanium silicon regions are doped to form source and drain regions and a gate is formed above the strained channel region to define a preferred p-channel MOSFET.

For this alternate specific example, a material that may be used to, at least in part, fill the trenches is silicon oxide (specifically, $SiO_2$) with a relatively high, for example 1-3%, concentration of impurities, for example boron, phosphorus or both boron and phosphorus. This material is often known as borophosphosilicate glass or BPSG. The boron or phosphorus impurities may allow the BPSG to undergo viscous flow at a relatively low temperature, for example 850° C. By heating the BPSG material to a temperature at which viscous flow occurs, the material becomes relatively more fluid, allowing stress-relieving deformation. When the BPSG is later cooled, the BPSG may become more solid, inhibiting further relaxation of stress.

Generally, the trench fill material may prevent full transfer of strain to the silicon active layer. Consequently, at least some implementations of the process remove the temporary trench fill materials following deposition of the sacrificial stressor layer to allow for more complete transfer of the strain from the stressor layer to the active layer. When the temporary fill materials are removed, the sacrificial stressor layer transfers strain to the active silicon layer. The trenches are then filled by forming one or more layers of silicon oxide and/or silicon nitride followed by planarization to define filled trenches. Further processing is performed, as described above, to remove the sacrificial stressor layer, to further planarize the trench isolation structures. Materials for filling the trenches are preferably selected to maintain the strain in the surface layer created by the sacrificial stressor layer. Processing as described above continues to form MOS field effect transistors or other devices with channels or active regions formed in the strained semiconductor surface region.

The distribution of strain in the various layers following trench formation is inhomogeneous and the final strain distribution is strongly dependent on the geometry of the layered structures, the separation of opposing trenches, and the depth and widths of the trenches. Another consideration is the different impact that the in-plane stress components have on carrier mobilities. For holes, tensile strain is particularly desirable along the width or transverse axis for the channel of a p-channel FET and uniaxial compressive strain is desirable along the length or longitudinal axis in a p-channel FET. Other implementations may form n-channel FETs in which the channel region has a direction with tensile strain and a second direction with compressive strain.

Alternative implementations of the present invention can provide uniaxial compressive strain in the top silicon layer directed along the length of the channel in a p-MOSFET while still obtaining a tensile strain in the width direction of the p-MOSFET channel. Preferred implementations may beneficially use the technique of applying compressive strain in the p-channel by growing layers of epitaxial silicon germanium selectively in recesses in the source and drain regions of the p-MOSFET. Since strains are superimposed linearly, the net effect of this action is the same as in conventional compressed silicon germanium source/drain implementations. Thus selective silicon germanium source and drain insert technology may be applied efficiently in implementations of the present invention to induce a uniaxial compressive stress along the length of a p-MOSFET in much the same way as silicon germanium source and drain stressors are applied in bulk silicon CMOS technology.

Alternately, where in-plane stress is not desired in the semiconductor along a particular axis in a semiconductor device, the trenches along that axis may be etched and filled after the removal of the sacrificial stressor layer, while trenches along a particular axis for which stress is desired may be etched and filled prior to the removal of the sacrificial stressor layer.

Other preferred implementations may use germanium-on-insulator as the semiconductor and an epitaxial silicon germanium alloy as the preferred buried and sacrificial stressor layers. In these preferred implementations, the stressor layer preferably has a germanium fraction in the range 0% to 80% and a thickness of less than or equal to a critical thickness for generation of dislocations. The silicon germanium stressor layer is under tensile stress and in-plane compressive strain is induced in the germanium active layer. Preferably, the trenches are etched to a depth sufficient to penetrate the buried insulator layer. The trench fill material is selected to be sufficiently non-compliant such that some amount of tensile strain remains in the germanium active layer after the sacrificial silicon germanium stressor layer is removed. Preferably known selective wet or dry etches or other wet or dry etches are used to remove the silicon germanium stressor layer, leaving the germanium layer underneath unetched and undamaged.

For a number of embodiments of the present invention, the stressor and active regions can generally be germanium silicon $Ge_xSi_{1-x}$, with the stressor layers able to apply either compressive or tensile stress to the active regions. To create the level of desired tensile or compressive strain in the active regions, the stressor layers preferably will have an "x" value in the above chemical formula of at least about 0.1 greater or smaller than the "x" value of the active regions. As discussed, the "x" value of the lateral stressor regions and the sacrificial stressor regions need not be the same. In the deposition process described above, the lateral and sacrificial stressor layers would be germanium silicon with a germanium component "x" at least about 0.1 larger than the active layer. Similarly, the active layer and substrate for a germanium silicon system will generally also have the composition $Ge_xSi_{1-x}$, with the active layer and the substrate typically having similar compositions with an "x" value of less than about 0.1. This example is provided in the context of the germanium silicon system. Other systems can be used and will have different but corresponding levels of compositional differences to achieve target tensile or compressive strains in active regions.

Note here that the various layers are described as having a nominally uniform composition as a function of the thickness within, for example, silicon germanium, layers. This is not intended to be limiting. Effective stressor and active layers can have compositional variations as a function of depth within the layer.

The description of the presently preferred methods does not include all of the processes or steps that might be performed in the manufacture of a device or integrated circuit. For example, transistor processing may, and preferably does, include halo implants, extension implants, source and drain silicidation and other processes preferred for high performance devices. Other implementations may include additional or complementary strain techniques in addition to the processes described above.

Figure 3:
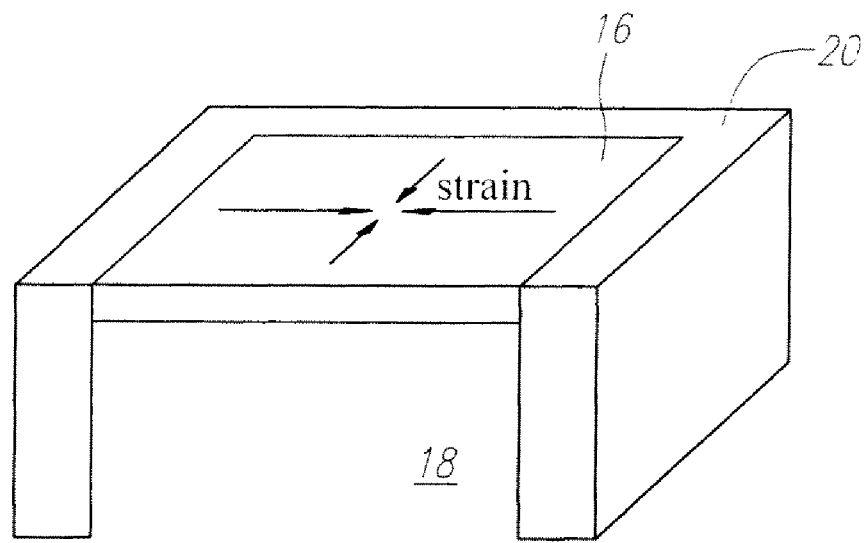

The various drawings of the preferred embodiments, such FIG. 3, are schematic and shows only a small fraction of the typical workpiece, which might be a 300 mm wafer or other commercially appropriate wafer format. Thicknesses of layers, the substrate and dimensions of all features shown in the drawings are not to scale. Those of ordinary skill in the art will appreciate that in many modern configurations, active device regions will be surrounded by a continuous set of interconnected trenches. Even though such a set of interconnected trenches can be viewed as a single trench, for clarity, the present discussion refers to the etched openings on opposite sides of an active region as different trenches. Some preferred embodiments of the invention use SOI substrates having buried insulator layers and etch trenches to the depth of or through the buried insulator layer. Etching trenches to such a depth is particularly preferred because it allows more complete relaxation and more complete stress transfer.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

We claim:

1. A method of manufacturing a semiconductor device, comprising:
    forming a sacrificial stressor layer over a semiconductor region having a semiconductor surface, the sacrificial stressor layer formed in a stressed state in comparison to its equilibrium state;
    transferring stress from the sacrificial stressor layer to the semiconductor region to strain the semiconductor region;
    stabilizing the strain in the semiconductor region and removing at least portions of the sacrificial stressor layer so that strain is present in the semiconductor region extending along at least a first in plane direction and a second in plane direction;
    etching first and second recesses through the semiconductor surface and into the semiconductor region to form a defined semiconductor region, the etching at least partially relaxing strain along the first direction within the defined region; and
    forming a transistor so that at least a portion of a channel region of the transistor is within the defined semiconductor region.

2. The method of claim 1, wherein the transferring stress comprises etching trenches through the sacrificial stressor layer and through the semiconductor region to a substrate below the semiconductor region to provide a strained region defined laterally on four sides by trench walls.

3. The method of claim 2, wherein the stabilizing comprises filling the trenches to maintain at least a portion of transferred stress within the semiconductor region and the removing at least portions of the sacrificial stressor layer is performed after the filling.

4. The method of claim 1, wherein the sacrificial stressor layer is silicon germanium.

5. The method of claim 1, wherein the sacrificial stressor layer is silicon nitride having a built-in compressive stress as-deposited.

6. The method of claim 1, further comprising etching trenches through the semiconductor surface and into the semiconductor region and filling the trenches with an insulating material.

7. The method of claim 6, wherein forming the sacrificial stressor layer comprises selectively depositing the sacrificial stressor layer on portions of the semiconductor surface following etching trenches.

8. The method of claim 7, further comprising:
filling the trenches to maintain at least a portion of strain transferred from the sacrificial stressor layer to the active region; and
removing remaining portions of the sacrificial stressor layer after the filling.

9. The method of claim 7, further comprising:
temporarily filling the trenches with temporary fill material prior to selectively depositing the sacrificial stressor layer;
removing the temporary fill material following the selectively depositing;
filling the trenches to maintain at least a portion of strain transferred from the sacrificial stressor layer to the active region; and
removing remaining portions of the sacrificial stressor layer after the filling.

10. The method of claim 1, wherein the first and second recesses are within the source and drain regions of the transistor.

11. The method of claim 1, wherein the forming a transistor comprises forming source and drain stressor regions in the first and second recesses to induce compressive strain along the defined semiconductor region.

12. The method of claim 11, wherein the source and drain stressor regions comprise germanium silicon regions.

13. The method of claim 11, wherein the source and drain stressor regions comprise a metal.

14. The method of claim 13, wherein the source and drain stressor regions comprise a reaction product of a metal and a semiconductor material.

15. The method of claim 14, wherein the reaction product is formed by a reaction between a deposited metal and semiconductor material proximate to edges of the first and second recesses.

16. The method of claim 15, wherein the semiconductor material comprises silicon, and the reaction forms a metal suicide.

17. A method of manufacturing a semiconductor device, comprising:
depositing a sacrificial stressor layer on a semiconductor region having a semiconductor surface, the sacrificial stressor layer deposited to have compressive stress in comparison to its equilibrium state;
etching trenches through the sacrificial stressor layer and through the semiconductor region to provide a strained region defined laterally on sides by trench walls, the etching trenches at least partially relaxing the sacrificial stressor layer;
filling the trenches to form trench isolation structures and subsequently removing at least portions of the sacrificial stressor layer so that tensile strain is present in the semiconductor region extending along at least a first in plane direction and a second in plane direction;
etching first and second recesses through the semiconductor surface and into the semiconductor region to form a defined semiconductor region, the etching at least partially relaxing tensile strain along the first direction within the defined semiconductor region;
forming source and drain stressor regions in the first and second recesses to induce compressive strain along the defined semiconductor region; and
forming a transistor so that at least a portion of a channel region of the transistor is within the defined semiconductor region.

18. The method of claim 17, wherein the source and drain stressor regions comprise germanium silicon regions.

19. The method of claim 18, wherein the forming a transistor comprises forming a gate stack and wherein the first and second recesses are formed after forming the gate stack.

20. The method of claim 19, wherein the germanium silicon regions are deposited epitaxially in the first and second recesses and wherein the germanium silicon is doped during deposition.

21. The method of claim 17, wherein the sacrificial stressor layer is germanium silicon.

22. The method of claim herein the sacrificial stressor layer is silicon nitride.

23. The method of claim 17, wherein the source and drain stressor regions comprise a metal.

24. The method of claim 23, wherein the source and drain stressor regions comprise a reaction product of a metal and a semiconductor material.

25. The method of claim 24, wherein the reaction product is formed by a reaction between a deposited metal and semiconductor material proximate to edges of the first and second recesses.

26. The method of claim 25, wherein the semiconductor material comprises silicon, and the reaction forms a metal silicide.

* * * * *